(12) United States Patent
Lesso

(10) Patent No.: US 11,552,609 B2
(45) Date of Patent: Jan. 10, 2023

(54) AMPLIFIER CIRCUITRY

(71) Applicant: Cirrus Logic International Semiconductor Ltd., Edinburgh (GB)

(72) Inventor: John P. Lesso, Edinburgh (GB)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 17/189,873

(22) Filed: Mar. 2, 2021

(65) Prior Publication Data
US 2022/0286101 A1    Sep. 8, 2022

(51) Int. Cl.
| | | |
|---|---|---|
| *H03F 3/38* | (2006.01) |
| *H03F 3/217* | (2006.01) |
| *H03F 3/72* | (2006.01) |
| *H03F 1/02* | (2006.01) |

(52) U.S. Cl.
CPC ............. *H03F 3/72* (2013.01); *H03F 1/0233* (2013.01); *H03F 1/0277* (2013.01); *H03F 2200/102* (2013.01)

(58) Field of Classification Search
CPC ........ H03F 3/72; H03F 1/0233; H03F 1/0277; H03F 2200/102; H03F 3/38; H03F 3/217; H03F 3/2173; H03F 3/2171; H03F 2200/351; H03F 1/0227; H03G 3/3042; H03G 3/004; H03G 3/3047; H03G 3/3036
USPC ....................... 330/10, 127, 129, 207 A, 251
See application file for complete search history.

(56) References Cited

U.S. PATENT DOCUMENTS

| | | | | |
|---|---|---|---|---|
| 6,396,933 | B1 * | 5/2002 | Jung ...................... | H03F 3/217 330/10 |
| 8,446,221 | B2 * | 5/2013 | Froidevaux ........... | H03F 1/0205 330/251 |
| 8,482,346 | B2 * | 7/2013 | Stanley ................. | H03F 3/2178 330/10 |

(Continued)

FOREIGN PATENT DOCUMENTS

| | | |
|---|---|---|
| EP | 2395656 A1 | 12/2011 |
| WO | 2010008188 A2 | 1/2010 |
| WO | 2019236009 A1 | 12/2019 |

OTHER PUBLICATIONS

International Search Report and Written Opinion of the International Searching Authority, International Application No. PCT/GB2022/050452, dated Jun. 3, 2022.

(Continued)

*Primary Examiner* — Khanh V Nguyen
(74) *Attorney, Agent, or Firm* — Jackson Walker L.L.P.

(57) ABSTRACT

The present disclosure relates to amplifier circuitry (300) that includes a linear amplifier stage (110) that receives an input signal and outputs a first drive signal to an output node (302) and a switching amplifier stage (130) operable to output a second drive signal to the output node (302). A controller (340) is selectively operable in a first dual-amplifier mode, in which switching of the switching amplifier stage is controlled based on a current of the first drive signal, such that the current of the first drive signal does not exceed a first current threshold magnitude; and at least one other mode, in which the controller controls the switching amplifier stage such that the current of the first drive signal may exceed the first current threshold magnitude. The controller (340) selectively controls the mode of operation based on an indication ($S_{SL}$) of signal level of the output signal.

17 Claims, 8 Drawing Sheets

(56) References Cited

U.S. PATENT DOCUMENTS

2007/0018719 A1  1/2007  Seven

OTHER PUBLICATIONS

Nam-In Kim et al: "Ripple feedback filter suitable for analog/digital mixed-mode audio amplifier for improved efficiency and stability", Power Electronics Specialists Conference; [Annual Power Electronics Specialists Conference], vol. 1, Jun. 23, 2002 (Jun. 23, 2002), pp. 45-49.

* cited by examiner

AMPLIFIER CIRCUITRY

TECHNICAL FIELD

The present application relates to amplifier circuitry, and, in particular, amplifier circuitry comprising a linear amplifier stage and a switching amplifier stage.

BACKGROUND

Many modern-day electronic systems and devices include amplifier circuitry for driving a load, e.g. for driving an audio output transducer such as a loudspeaker, or an ultrasonic or haptic transducer, or the like. Amplifier circuitry design has developed over a considerable length of time to a point where present-day amplifiers exist in a wide variety of designs with various advantages and disadvantages in performance.

One area in which amplifier performance is of particular importance is in consumer electronic devices, which may include, for example, mobile phones, laptops, tablet computers, smartwatches and desktop PCs. For instance, for amplifier circuitry in an audio output chain of such electronic devices, the amplifier circuitry may be selected to exhibit good linearity over the frequency range of interest, ideally with minimal distortion and noise.

Linear amplifiers, such as class A and class AB amplifiers have been used for such applications, as such amplifiers generally have good linearity performance.

However, power consumption and efficiency is also be an important consideration in many electronic systems and devices. Efficiency is of particular importance in portable, battery powered, electronic devices. Switching amplifiers, such as class D amplifiers have found wide-spread use in the audio output chain of many portable electronic devices due to their desirable efficiency performance. Coupled with appropriate power supply and filter circuitry, switching amplifiers, such as a class D amplifier can also exhibit desirable linearity and noise performance.

Designers of amplifier circuitry in portable electronic devices thus generally aim to develop amplifier circuitry with desirable linearity and efficiency characteristics. Whilst many amplifier designs and topologies have been developed with these characteristics in mind, improvements in this field are still desired.

SUMMARY

Thus, according to a first aspect there is provided amplifier circuitry configured to receive an input signal and output an output signal at an output node, comprising: a linear amplifier stage configured to receive the input signal and output a first drive signal to the output node; a switching amplifier stage operable to output a second drive signal to the output node; and a controller for controlling the amplifier circuitry. The controller is selectively operable in: a first dual-amplifier mode in which the controller controls switching of the switching amplifier stage based on a current of the first drive signal such that the current of the first drive signal does not exceed a first current threshold magnitude; and at least one other mode wherein the controller controls the switching amplifier stage such that the current of the first drive signal may exceed the first current threshold magnitude. The controller is configured to selectively control said mode of operation based on an indication of signal level of the output signal.

In some implementations, the at least one other mode comprises a single-amplifier mode, in which the switching amplifier stage is inactive and the first drive signal provides the entirety of the output signal. The controller may be configured to operate in the single-amplifier mode when the indication of signal level of the output signal is less than a first signal level threshold. In the single-amplifier mode, the controller may be configured to control an amount of biasing applied to the linear amplifier stage to be lower than in the first dual-amplifier mode.

Additionally or alternatively, the at least one other mode may comprise a second dual-amplifier mode, in which the controller controls switching of the switching amplifier stage based on the current of the first drive signal such that the current of first drive signal does not exceed a second current threshold magnitude, where the second current threshold magnitude is greater than the first threshold magnitude. The controller may be configured to operate in the first dual-amplifier mode when the indication of signal level of the output signal indicates a first signal level and to operate the first dual-amplifier mode when the indication of signal level of the output signal indicates a second, lower, signal level. In some examples, the controller may be operable to control switching of the switching amplifier stage based on the current of the first drive signal so as to limit the current of the first drive signal to a current limit and the controller may be configured to vary the current limit based on the indication of signal level of the output signal so as to provide at least said first and second dual-amplifier modes of operation. The controller may be configured such that the current limit is substantially continuously variable over at least a range of signal levels of the output signal.

In some examples, the controller may be configured to controllably vary the current limit by controlling a delay applied between the current of the first drive signal reaching a reference value and switching of the switching amplifier. The amplifier circuitry may further comprise a monitoring circuit which may be configured to monitor the first drive signal against the reference value and a variable delay element in a signal path between the monitoring circuit and the controller. The controller may be configured to control a delay of the variable delay element.

The indication of signal level of the output signal may be one of: an indication of the instantaneous signal level of input signal; an indication of an envelope value of the input signal; an indication of a gain applied to the input signal and an indication of a volume setting for the input signal.

In examples where the indication of signal level of the output signal is one of: an indication of an envelope value of the input signal and an indication of a gain applied to the input signal; the controller may be configured to synchronise any change in mode of operation to a zero-crossing of the input signal.

In some examples, the controller may be configured to receive a clock signal and control the switching amplifier stage such that any switching of the switching amplifier stage is synchronous to the clock signal.

The amplifier circuitry may be implemented as an integrated circuit.

An aspect also relates to an electronic device comprising amplifier circuitry according to any of the embodiments described herein. The electronic device may be at least one of a: portable device; a battery powered device; a communications device; a mobile or cellular telephone; a smartphone device; a computing device; a laptop, notebook or tablet computer; a gaming device; a wearable device; a voice-controlled or voice activated device.

In another aspect, there is provided amplifier circuitry configured to receive an input signal and output an output signal at an output node, comprising: a linear amplifier stage configured to receive the input signal and output a first drive signal to the output node; a switching amplifier stage operable to output a second drive signal to the output node; and a controller operable to control the switching amplifier stage. The controller is configured to receive an indication of signal level of the output signal and is operable such that: at a first signal level of the output signal the controller controls switching of the switching amplifier stage based on a current of the first drive signal so that the current of the first drive signal does not exceed a first current limit; and at a second, lower, signal level of the output signal, the controller controls switching of the switching amplifier so that the current of the first drive signal may exceed the first current limit.

The controller of this aspect may be configured such that, at the second signal level of the output signal, the controller disables switching of the switching amplifier stage. The controller may be configured such that, at said second signal level of the output signal, the controller controls switching of the switching amplifier stage based on the current of the first drive signal so that the current of the first drive signal does not exceed a second current limit, which is greater than the first current limit.

In a further aspect there is provided amplifier circuitry configured to receive an input signal and output an output signal at an output node, comprising: a linear amplifier stage configured to receive the input signal and output a first drive signal to the output node; a switching amplifier stage operable to output a second drive signal to the output node; and a controller operable to control switching of the switching amplifier stage based on a current of the first drive signal so that the current of the first drive signal does not exceed a first current limit. The controller is configured to receive an indication of signal level of the output signal and is configured to control the switching amplifier stage so as to selectively vary said current limit and/or to selectively disable switching of the switching amplifier stage based on the indication of signal level of the output signal.

It should be noted that, unless expressly indicated to the contrary herein or otherwise clearly incompatible, then any feature described herein may be implemented in combination with any one or more other described features.

BRIEF DESCRIPTION OF THE DRAWINGS

For a better understanding of examples of the present disclosure, and to show more clearly how the examples may be carried into effect, reference will now be made, by way of example only, to the following drawings in which.

DETAILED DESCRIPTION

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiments discussed below, and all such equivalents should be deemed as being encompassed by the present disclosure.

Figure 1:
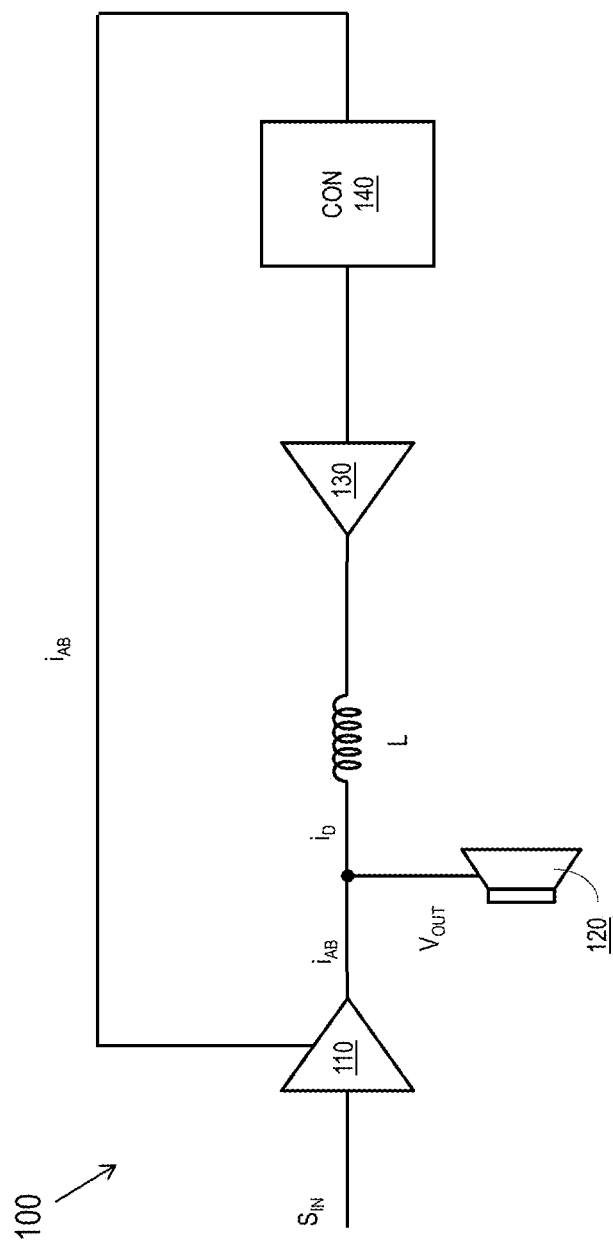
FIG. 1 illustrates an example of amplifier circuitry.

FIG. 1 illustrates an example of amplifier circuitry 100 configured to receive an input signal $S_{IN}$ and output an output signal $V_{OUT}$. Circuitry 100 comprises a linear amplifier 110, which in this example is a class AB amplifier, configured to receive the input signal SIN and output a first drive signal $i_{AB}$ to an output node, connected to load 120. In some examples, circuitry 100 may comprise an alternative linear amplifier to the class AB amplifier, such as a class A amplifier etc.

Circuitry 100 further comprises a switching amplifier 130, e.g. a class D amplifier, configured to output a second drive signal $i_D$ to load 120. In the example of FIG. 1, the circuitry 100 further comprises inductor L configured to provide filtering at the output of class D amplifier 130. Circuitry 100 further comprises controller 140 configured to control operation of class D amplifier 130 based on a current of the first drive signal $i_{AB}$.

As one skilled in the art would understand, circuitry 100 illustrates amplifiers 110, 130, in a dual amplifier arrangement, which may be referred to as a helper amplifier topology. Such an amplifier topology comprises a linear amplifier, such as class AB amplifier 110, and a switching amplifier, such as class D amplifier 130. In operation, the switching amplifier, such as class D amplifier 130, provides the majority of the power for driving the load 120 but the linear amplifier, such as class AB amplifier 110, is also simultaneously active to provide a contribution to the overall output signal. In this way, the helper amplifier topology can utilise the desirable efficiency characteristics of the switching amplifier for providing the majority of the power for driving the load 120, whilst benefiting from the linear characteristics of the linear amplifier.

The linear amplifier, such as class AB amplifier 110, receives the input signal $S_{IN}$ and is operable to provide a drive signal to the load 120 connected to the output node based on the input signal $S_{IN}$. However, rather than linear amplifier 110 driving the load on its own, the switching amplifier 130 is also simultaneously active to provide a drive signal to the output node, and hence to the load. As will be discussed in more detail below, the amplifier circuitry may be configured so that the drive signal from the switching amplifier provides most of the power for driving the load and, in effect, the drive signal from the linear amplifier compensates or corrects for error in the drive signal from the switching amplifier. To achieve this operation, as described in more detail below, the magnitude of the current of the drive signal output by the linear amplifier is constrained about a current limit, e.g. a current threshold $i_{TH}$. If the current threshold $i_{TH}$ is a relatively small value, thus limiting the current drawn by the linear amplifier to this small value, the absolute power consumed by the linear amplifier is kept relatively low and the relatively poorer efficiency performance of the linear amplifier may not have a significant impact on the overall efficiency performance of the amplifier circuit.

In operation, the linear amplifier 110 receives the input signal and outputs the first drive signal $i_{AB}$ to drive the load 120. The switching amplifier is configured to simultaneously output the second drive signal $i_D$, and is controlled such that the magnitude of current of the first drive signal does not substantially exceed the current threshold $i_{TH}$. In particular, switching of the switching amplifier 130 may be triggered or controlled by the current of first drive signal $i_{AB}$ reaching the current threshold $i_{TH}$. As will be understood by one skilled in the art, the output of the switching amplifier stage 130 will generally be switched between high and low switching voltages, and when switched to the high voltage the current of the second drive signal $i_D$ through the inductor will ramp up, and when switched to the low voltage the current of the second drive signal $i_D$ through the inductor will ramp down. The linear amplifier 110 drives its output so that the output signal $V_{OUT}$ due to the combined effect of the first and second drive signals $i_{AB}$ and $i_D$ maintains the correct level based on the input signal $S_{IN}$.

For instance, consider that, at a first point in time, the output of the switching amplifier 130 is connected to the low switching voltage and the current of the second drive signal $i_D$ is ramping down. The linear amplifier 110 will operate to drive the output signal $V_{OUT}$ to the correct signal level based on the input signal $S_{IN}$ received and thus the current of first drive signal $i_{AB}$ will tend to ramp up, to maintain the output signal $V_{OUT}$ at the correct level and to meet the load current demand. The current of the first drive signal $i_{AB}$ will increase until it reaches the current threshold $+i_{TH}$, at which point the switching amplifier 130 will be switched so that its output is connected to the high switching voltage. In this state, the current of the second drive signal $i_D$ will ramp up, and consequently the current of the first drive signal $i_{AB}$ from the linear amplifier may ramp down. As the current of the second drive signal $i_D$ continues to ramp upwards, the current $i_{AB}$ from the linear amplifier 110 may go negative, to maintain the output signal $V_{OUT}$ at the correct level. The current of the first drive signal $i_{AB}$ may continue to ramp down (as the current of the second drive signal $i_D$ increases) until it reaches current threshold $-i_{TH}$, at which point the switching amplifier 130 may switch back to the low switching voltage.

The amplifier thus operates in this manner, with the switching of the switching amplifier 130 controlled based on the current of the first drive signal $i_{AB}$ such that the current of the first drive signal $i_{AB}$ is constrained about $+/-i_{TH}$.

Figure 2:
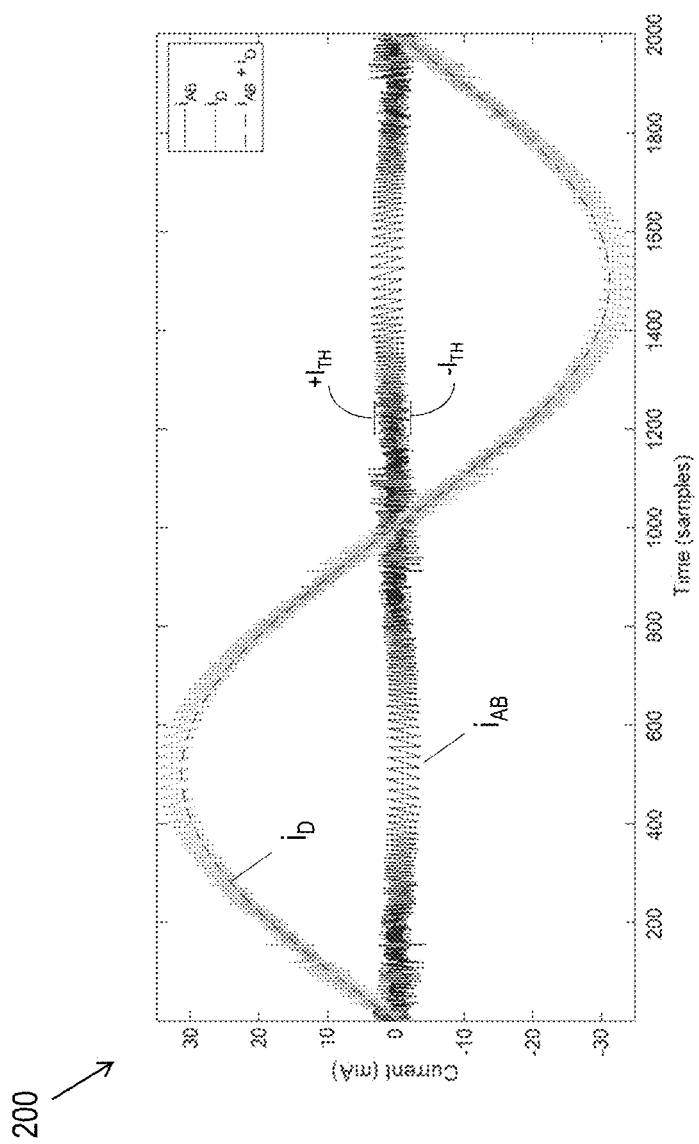
FIG. 2 illustrates an example of current waveforms for the amplifier of FIG. 1.

FIG. 2 illustrates a graph 200 showing example current waveforms of first drive signal $i_{AB}$ and second drive signal $i_D$, of circuitry 100 described above.

As described above and as illustrated in FIG. 2, the current of the first drive signal $i_{AB}$ ramps up and down between current threshold $+i_{TH}$ and current threshold $-i_{TH}$ such that the current of first drive signal $i_{AB}$ is substantially constrained to $+/-i_{TH}$. However, the current of second drive signal $i_D$ is not so constrained. Thus, the second drive signal from the switching amplifier can provide the majority of the load current demand and thus the switching amplifier can provide the majority of the power for driving load 120 over the whole signal cycle.

The second drive signal $i_D$ exhibits a switching ripple due to switching of the output of the switching amplifier between the high and low switching voltages. It can be seen, however, that the current of the first drive signal $i_{AB}$ output from the linear amplifier 110 exhibits a substantially equal and opposite ripple. By driving a load with first drive signal $i_{AB}$ and second drive signal $i_D$ combined, the first drive signal $i_{AB}$ may at least partially cancel or correct for the switching ripple in the second drive signal, thus leading to the output signal $V_{OUT}$ as seen by the load exhibiting a reduced ripple or greater linearity.

Circuitry 100 comprising class AB amplifier 110 and class D amplifier 130 configured in a dual amplifier or helper amplifier topology, as described above, can thus produce an output signal $V_{OUT}$ which takes advantage of the linearity properties of a linear amplifier, but which also utilises the desirable efficiency properties of a switching amplifier.

Embodiments of the present disclosure relate to amplifier circuitry that may be operable in such a dual-amplifier mode of operation, but which may offer additional efficiency benefits.

Figure 3:
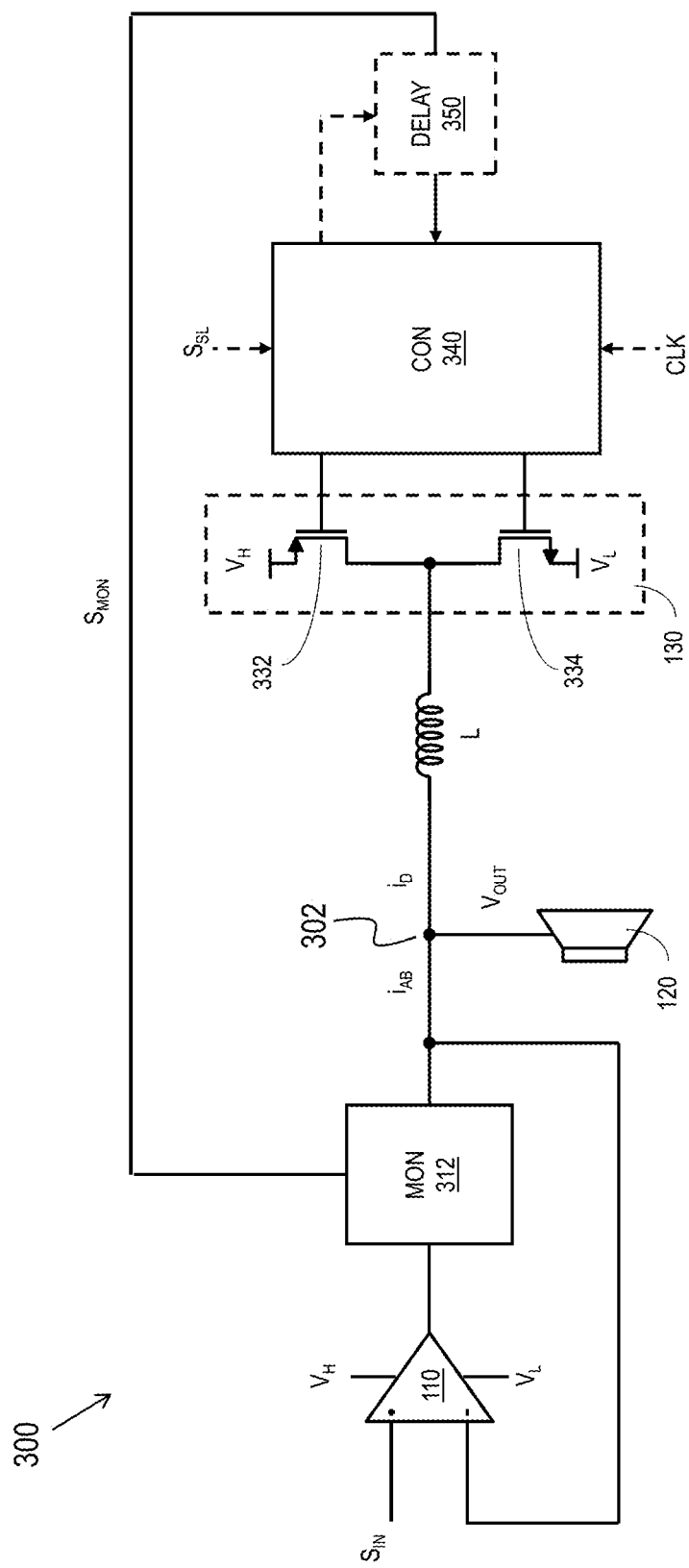
FIG. 3 illustrates an example of amplifier circuitry according to an embodiment.

FIG. 3 illustrates an example of amplifier circuitry 300 according to an embodiment. Amplifier circuitry 300 includes a number of elements in common with circuitry 100 described above with reference to FIG. 1. Such common elements are denoted by common reference numerals.

Circuitry 300 comprises a linear amplifier stage 110 configured to receive an input signal $S_{IN}$ and output a first drive signal $i_{AB}$ to an output node 302 of the circuitry 300, which, in use, is connected to load 120. In the illustrated example of FIG. 3, load 120 comprises an audio load or audio transducer. However, in other examples load 120 may comprise any suitable load or transducer including, for example, a light source, such as an LED, or a haptic transducer.

The linear amplifier stage 110 may comprise a class AB amplifier and is configured to receive an input signal $S_{IN}$ and output first drive signal to the output node 302, and hence the load 120. The linear amplifier 110 is powered from high and low supply voltages $V_H$ and $V_L$, which may, for example, be positive and negative supply voltages, or a supply voltage and ground. The amplifier circuitry 300 further comprises current monitoring circuit 312 configured to monitor the current of first drive signal $i_{AB}$ and output a monitoring signal $S_{MON}$ to controller 340. In some examples, current monitoring circuit 312 may comprise a comparator configured to compare the current of the first drive signal $i_{AB}$ to a current magnitude threshold $i_{TH}$. For example, the comparator may be configured to compare the current of the first drive signal $i_{AB}$ to a positive current threshold $+i_{TH}$ and a negative current threshold $-i_{TH}$.

Circuitry 300 further comprises switching amplifier stage 130, which may comprise a class D amplifier configured to output second drive signal $i_D$ to load 120 via the output node 302. Switching amplifier stage 130 comprises first switch 332, for example a PMOS switch, configured to selectively connect the output of the switching amplifier stage 330 to the high supply voltage $V_H$ and a second switch 334, for example an NMOS switch, configured to selectively connect the output of the switching amplifier stage 330 to the low supply voltage $V_L$.

Circuitry 300 thus illustrates linear amplifier stage 110 and switching amplifier stage 130 configured in a dual amplifier or helper amplifier topology, which, as described above, can utilise the desirable efficiency properties of switching amplifier stage 130 for providing the majority of the power for driving load 120, whilst also utilising the desirable linearity properties of the linear amplifier stage 110 for driving load 120.

In embodiments of the present disclosure, controller 340 may be configured to selectively operate the amplifier circuitry 300 in one of a plurality of different modes of operation. In a first mode of operation, the linear amplifier stage 110 and the switching amplifier stage 130 are both simultaneously active and controller 340 controls switching amplifier 130, based on the current of the first drive signal $i_{AB}$ such that the current of the first drive signal $i_{AB}$ does not exceed a first threshold current magnitude $i_{TH1}$ as described above. This mode may be referred to herein as a first dual-amplifier mode, as in this mode both the linear amplifier stage 110 and the switching amplifier stage 130 are both simultaneously active. In the first dual-amplifier mode, controller 340 may therefore receive monitoring signal $S_{MON}$ representative of first drive signal $i_{AB}$ and control the switching of the switching amplifier based on the current of first drive signal $i_{AB}$ reaching the current magnitude threshold $i_{TH1}$.

The first mode of operation can thus be seen as a conventional mode of operation of a dual-amplifier circuit that can take advantage of the properties of both the linear amplifier 110 and the switching amplifier 130.

However, in embodiments of the present disclosure, the controller 340 is also operable in other modes of operation in which the current from the linear amplifier 110 is allowed to exceed the first current threshold $i_{TH1}$. As will be described in more detail below, in some use cases it may be advantageous, in terms of power efficiency, to allow the linear amplifier to supply a greater current.

One factor in the power efficiency of a switching amplifier, such as a class D amplifier, is switching losses, e.g. the power consumed with charging and discharging the gates of the MOS switches and increased conduction losses as the switches transition from being on to off and vice versa. The amount of switching losses depends on the switching frequency of the switching amplifier in operation.

The switching frequency $f_{SW}$ of switching amplifier stage 130 can be approximated by equation (1):

$$f_{SW} = \frac{V_{SUP}^2 - V_{OUT}^2}{4Li_{TH}V_{SUP}}$$

where $V_{SUP}$ is the supply voltage, i.e. the magnitude of $V_H$ and $V_L$ if positive and negative supply voltages, $V_{OUT}$ is the voltage of the output signal, L is the inductance of inductor L and $i_{TH}$ is the current threshold magnitude for first drive signal $i_{AB}$.

In examples in which circuitry 300 is deployed in a portable electronic device to drive an audio load, the inductance L will typically be relatively small. Furthermore, to minimise the power consumption of the linear amplifier stage 110, generally, the threshold current $i_{TH}$ should also be a small value. These conditions generally lead to a relatively high switching frequency $f_{SW}$, for example of the order of MHz or so.

For relatively high amplitude, and hence high power, output signals, the switching losses at such frequencies represent only a relatively small proportion of the overall power consumption. However, for lower amplitude, and hence lower power, output signals, this relatively high switching frequency can result in the switching losses being a relatively significant proportion of the total power consumption, which can detrimentally affect the efficiency of the switching amplifier stage 130. Thus, whilst the switching amplifier 130 may generally be more efficient than the linear amplifier stage 110, at some low output signal amplitudes, the switching frequency $f_{SW}$ of the switching amplifier stage 130 with the associated switching losses will represent a relatively significant proportion of the overall power consumption, thus detrimentally affecting the efficiency of the switching amplifier 130.

The efficiency $\eta_{AB}$ of a class AB amplifier 110 is generally given by equation (2):

$$\eta_{AB} = \frac{\pi}{4}\frac{V_{OUT}}{V_{SUP}}$$

The power $P_{AB}$ drawn by the class AB amplifier from a power supply to provide a load power $P_{LOAD}$ to load 120 is given by equation (3):

$$P_{AB} = \frac{P_{LOAD}}{\eta_{AB}} + P_{BIAS}$$

where $P_{BIAS}$ is the power associated with biasing the amplifier, as will be understood by one skilled in the art.

The efficiency $\eta_D$ of a class D switching amplifier stage is generally given by equation (4):

$$\eta_D = \frac{R_{LOAD}}{R_{LOAD} + R_{DS}}$$

where $R_{LOAD}$ is the load resistance and $R_{DS}$ is on resistance of the components of the switching amplifier stage 330, such as switches 332, 334.

The power drawn by the switching amplifier $P_D$ from a power supply to provide a load power $P_{LOAD}$ to load 120 is given by equation (5):

$$P_D = \frac{P_{LOAD}}{\eta_D} + P_{SWITCH}$$

where $P_{SWITCH}$ is the power drawn from the switching of first and second switches 332, 334 of switching amplifier stage 330, i.e. the switching losses.

Figure 4:
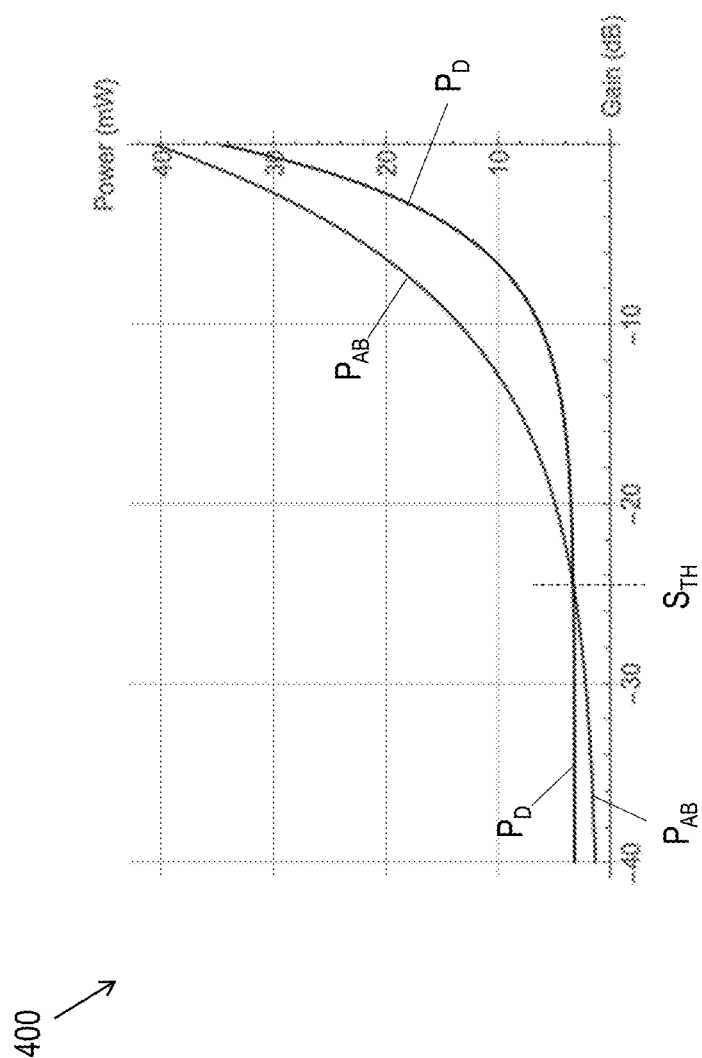
FIG. 4 illustrates example power curves for linear and switching amplifiers.

FIG. 4 illustrates a graph 400 showing an example of the power $P_{AB}$ drawn by the class AB amplifier and the power $P_D$ drawn by the switching amplifier for amplifying input signal $S_{IN}$ over a range of gain values to achieve a desired output signal level $V_{OUT}$. As illustrated, at small signal levels the power $P_{AB}$ drawn by the class AB amplifier can be less than the power $P_D$ drawn by the switching amplifier. However, for larger signal levels, the power $P_{AB}$ drawn by the class AB amplifier is greater than the power $P_D$ drawn by the switching amplifier. Thus, for small signal levels, the linear amplifier stage 110 may be more efficient for driving the load 120 than the switching amplifier stage 130, whereas for larger signal levels, the switching amplifier stage 130 is more efficient. The signal level at which the switching amplifier stage 130 becomes more efficient than the linear amplifier stage 110 for driving load 120 may be referred to as the signal level threshold $S_{TH}$.

Referring again to FIG. 3, thus, in some examples, controller 340 may be configured to receive an indication $S_{SL}$ of the expected signal level of the output signal $V_{OUT}$ and may, based on the expected level of the output signal $V_{OUT}$, be configured to selectively control circuitry 300 in a mode in which the switching amplifier stage 130 is inactive, e.g. switching of the switching amplifier is disabled, and the linear amplifier stage 110 alone is used to drive the load, so that the first drive signal provides the entirety of the output signal. This mode of operation may thus be referred to herein as a single-amplifier mode, as in this mode, only the linear amplifier 110 is used to drive the load.

As described above, the linear amplifier stage 110 may be more efficient for driving the load 120 than the switching amplifier stage 130 for small signal levels. Controller 340 may thus be configured to monitor the indication $S_{SL}$ of the expected level of the output signal $V_{OUT}$ against a signal level threshold $S_{TH}$. The signal level threshold $S_{TH}$ may be based on a signal level at which the switching amplifier stage 130 becomes more efficient for driving load 120 than the linear amplifier stage 110, in particular the signal level threshold $S_{TH}$ may correspond to a signal level at which it is more efficient to use the switching amplifier stage 130 in addition to the linear amplifier stage 110, rather than operate with the linear amplifier stage alone. In embodiments of the disclosure, the amplifier circuitry 300 may thus be configured so as to not use the switching amplifier stage 130 when the indication $S_{SL}$ of the expected level of the output signal $V_{OUT}$ is below the signal level threshold $S_{TH}$, and thus avoid the associated switching losses. In this single-amplifier mode of operation, as the operation of switching amplifier 130 is disabled, the current of the first drive signal $i_{AB}$ will not be constrained to the current threshold $+/-i_{TH1}$, and thus in some cases could potentially exceed the threshold.

If, however, the indication $S_{SL}$ of the expected level of the output signal $V_{OUT}$ is greater than the signal level threshold $S_{TH}$, the controller 340 may operate in the first dual-amplifier mode, i.e. with the switching amplifier stage 130 also active to output the second drive signal $i_D$ to load 120, and controlled such that first drive signal $i_{AB}$ is constrained to the first current threshold magnitude $+/-i_{TH1}$, in a similar manner as described above. Thus, when the indication $S_{SL}$ of the expected level of the output signal $V_{OUT}$ is greater than the signal level threshold $S_{TH}$, the controller activates the switching amplifier stage 130 and operates the circuitry 300 in a dual-amplifier mode of operation, as described above.

For example, consider that the indication of signal level of the output signal $V_{OUT}$ is below the signal level threshold $S_{TH}$ at a first time, but subsequently increases and reaches the signal level threshold $S_{TH}$ at a second time. In such a case, the controller may be operating in the single-amplifier mode, with the switching amplifier stage 130 deactivated, at the first time, but, responsive to the expected level of the output signal $V_{OUT}$ crossing the signal level threshold $S_{TH}$ at the second time, the controller 340 may switch to the first dual-amplifier mode of operation and activate the switching amplifier stage 130 to output the second drive signal $i_D$ to load 120, such that first drive signal $i_{AB}$ is again constrained to the first current threshold magnitude $+/-i_{TH1}$. In some embodiments the controller 340 may maintain operation in the first dual-amplifier mode until the indication $S_{SL}$ of the signal level of the output signal drops below the signal threshold $S_{TH}$. Thus, the controller 340 may dynamically activate and disable the switching amplifier stage 130 based on the indication of the signal level of the output signal $V_{OUT}$.

The indication $S_{SL}$ of the signal level of the output signal $V_{OUT}$ may be provided in a variety of ways. In some applications the indication of the signal level of the output signal $V_{OUT}$ could be an indication of the expected instantaneous level of the output signal, such that the amplifier circuitry may swap between the dual-amplifier and single-amplifier modes of operation as the instantaneous value of output signal varies. However, in some applications it may not be practical or desirable to switch between the modes of operation on a timescale related to the frequency of the output signal. In at least some applications the indication $S_{SL}$ of the signal level of the output signal $V_{OUT}$ may thus be an indication of an amplitude or envelope value, or an expected peak signal level, for the output signal $S_{OUT}$. Conveniently, the indication of the expected signal level of the output signal $V_{OUT}$ may be derived from the input signal $S_{IN}$.

In some instances the controller 340 may thus receive a version of the input signal $S_{IN}$ as the indication $S_{SL}$ of the expected level of the output signal and determine a suitable amplitude or envelope value, possibly taking any applied gain, e.g. user-controlled volume of the like, into account if necessary. In other implementations the controller 340 the indication $S_{SL}$ of signal level could be an envelope value for the input signal $S_{IN}$ determined by some other functional module. In some applications the input signal $S_{IN}$ may be tapped from a point in a signal path that is upstream of some processing circuitry that has an associated propagation delay or latency to provide some look-ahead of expected changes in signal level. As will be understood by one skilled in the art, in some applications, for instance for driving an audio transducer, there may be some processing of the audio signal upstream of the amplifier which may have an associated propagation delay, for instance there may be digital processing circuitry for converting and/or interpolating or upsampling a received digital audio signal upstream of the amplifier circuitry, which involves a processing latency. Using a version of the input signal from upstream of such processing circuitry to determine an envelope value can provide a look-ahead of changes in the signal level before the relevant part of the signal reaches the amplifier circuitry.

In some applications, however, it may be sufficient to use a gain setting, e.g. a volume setting, as the indication $S_{SL}$ of expected signal level as such a gain setting will determine the maximum amplitude of output signal $V_{OUT}$ that could be expected.

In some examples, where the mode of operation is based on an indication of the amplitude of the output signal, the controller 340 may be configured to switch operation of the switching amplifier stage 130 between an activated state and a disabled state at a zero cross of the output signal $V_{OUT}$, i.e. at a zero crossing of the instantaneous signal level of the output signal. For example, if the controller determines that the indication $S_{SL}$ of the expected level of the output signal $V_{OUT}$ crosses the signal level threshold $S_{TH}$, the controller may not immediately change modes and may instead delay the mode change until a zero cross of the input signal $S_{IN}$, and hence the output signal $V_{OUT}$. Switching operation of the switching amplifier stage 130 at a zero cross of the output signal $V_{OUT}$ may reduce the effect on distortion that may result from the activation and deactivation of the switching amplifier stage 130.

Selectively operating in single-amplifier mode of operation based on output signal level may further improve the efficiency of the dual amplifier or helper amplifier topology of circuitry 300 by avoiding the switching losses of the switching amplifier at low signal levels, where using the linear amplifier on its own is more efficient. For larger signal levels, however, the first dual-amplifier mode of operation provides the efficiency benefits of using the switching amplifier and limiting current through the linear amplifier.

In some examples, controller 340 may be configured to control an amount of bias applied to linear amplifier 110, based on the mode of operation. In some examples, when the switching amplifier stage 130 is active in the first dual-amplifier mode, the linear amplifier stage 110 should preferably have a relatively low output impedance at the switching frequency of the switching amplifier for stability. However, in the single-amplifier mode, when the switching amplifier stage 130 is disabled, the need for such a low output impedance is reduced. As such, when operating in the single-amplifier mode, controller 340 may reduce a bias applied to linear amplifier stage 110, e.g. a bias current, which may reduce the power drawn by the linear amplifier stage 110 in this mode of operation, providing additional efficiency benefits.

Thus, in addition to the first dual-amplifier mode of operation, in which the switching amplifier and the linear amplifier are both active and the magnitude of the current output from the linear amplifier is limited to a threshold $i_{TH1}$, the controller may selectively operate the amplifier circuitry in a single-amplifier mode of operation, with the switching amplifier disabled, so as to improve power efficiency, at small signal levels.

Additionally or alternatively, controller 340 may be operable in an additional mode, which will be referred to herein as a second dual-amplifier mode, in which, the switching amplifier and the linear amplifier are both active simultaneously, but the current threshold for linear amplifier is different to that of the first dual-amplifier mode. Thus, in the second dual-amplifier mode of operation, both the linear amplifier stage 110 and the switching amplifier stage 130 are active, and the controller 340 controls switching of the switching amplifier stage based on the current of the drive signal $i_{AB}$ of the linear amplifier, but the switching is controlled based on a second current threshold magnitude $i_{TH2}$, which has a different magnitude to the first current threshold $i_{TH1}$ used in the first dual-amplifier mode. In particular, the second current threshold $i_{TH2}$ may be greater than the first current threshold $i_{TH1}$. The amplifier circuit is thus operated, in the second dual-amplifier mode, such that the current of first drive signal $i_{AB}$ does not substantially exceed the second current threshold $i_{TH2}$, but this may allow the current of the linear amplifier to exceed to the first current threshold $i_{TH2}$. The controller 340 may be configured to vary between the first and second dual-amplifier modes of operation based on the indication $S_{SL}$ of output signal level, such that the amplifier circuitry 300 operates in the first dual-amplifier mode, with the first current threshold $i_{TH1}$, for a first output signal level whereas, for a second, different, signal level of the output signal, the amplifier circuitry operates in the second dual-amplifier mode, with the second current threshold $i_{TH2}$. Where the second current threshold $i_{TH2}$ corresponds to a greater current magnitude than the first current threshold $i_{TH1}$, the first output signal level may be greater than the second output signal level, i.e. the controller may operate in the first dual amplifier mode for a first output signal level but operate in the second dual-amplifier mode, with a higher current threshold for the linear amplifier, for a second, lower, output signal level. This operation can reduce the switching losses associated with operating the switching amplifier stage 130 in a dual-amplifier mode of operation.

Figure 5:
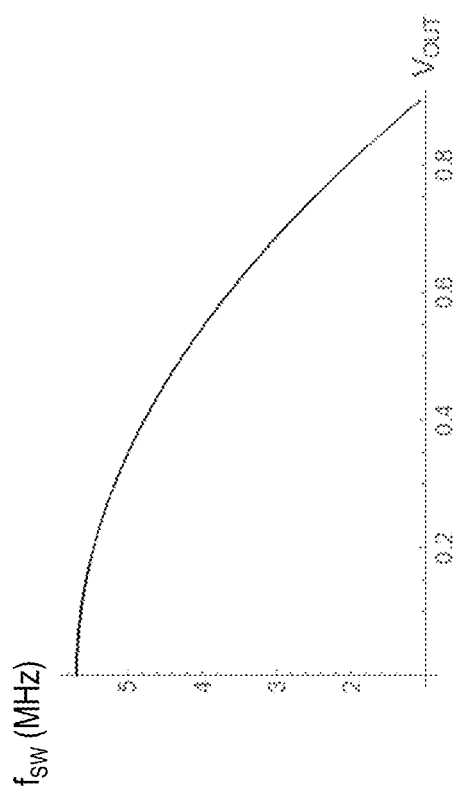
FIG. 5 illustrates an example of how switching frequency of the switching amplifier may vary with output signal level.

As discussed above with reference to equation 1, the switching frequency of the switching output stage in a dual-amplifier topology varies with the output signal $V_{OUT}$. FIG. 5 is an example of a graph 500 illustrating the switching frequency $f_{SW}$ of switching amplifier stage 130 against output signal $V_{OUT}$.

Referring to FIG. 5, it can be seen the switching frequency $f_{SW}$ of the switching amplifier 130 increases with decreasing signal level of the output signal $V_{OUT}$ This can also be seen from the waveforms of FIG. 2 where the switching frequency can be seen to reduce at the peak magnitude of the instantaneous output signal. Thus, the switching frequency $f_{SW}$ of the switching amplifier 130, and hence the associated switching power drain, i.e $P_{SWITCH}$, is greater for smaller signal levels of the output signal than for larger signal levels. As noted above, at smaller signal levels, the switching losses can represent a relatively significant proportion of the power consumption of the switching amplifier stage 130. It can also be seen from FIG. 5 that the degree of variation in switching frequency can be relatively significant, in this example the switching frequency at lower output signal levels may be at least double that at higher output signal levels.

As described above, at low signal levels, it may be more efficient to disable switching amplifier 130 and operate in the single-amplifier mode, such that linear amplifier stage 110 provides all the power to drive the load 120.

However, additional or alternative improvements in power efficiency may also be achieved by operating in a dual-amplifier mode of operation, with both the linear amplifier stage 110 and the switching amplifier stage 130 simultaneously active, and controllably varying the current threshold for the linear amplifier stage based on the indication $S_{SL}$ of output signal level.

From equation (1), it can be seen that the switching frequency $f_{SW}$ is dependent on output signal voltage $V_{OUT}$ but is also inversely proportional to the current threshold $i_{TH}$. Thus, at any given level of output signal, using a higher current threshold $i_{TH}$ will lead to a lower switching frequency and hence reduced switching losses. In effect, by allowing the current through the linear amplifier stage 110 to ramp to a greater magnitude, before triggering switching of the switching amplifier stage 130, the switching frequency of the switching amplifier stage is reduced. Using a higher current threshold, i.e. allowing more current to flow through the linear amplifier stage 110, does mean that a greater amount of power is drawn by the linear amplifier stage, but for at least some output signal levels, the benefit of the reduced switching losses, due to the reduced switching frequency, may outweigh the additional power drawn by the linear amplifier stage 110. However, for higher signal levels of the output signal $V_{OUT}$, the increased signal level will itself result in a reduced switching frequency $f_{SW}$ of the switching amplifier stage 130, and hence a reduction in switching losses. Thus, at higher signal levels of the output signal, given the switching losses of the switching amplifier stage are lower in any case, there may be a greater efficiency advantage in using a lower current threshold, so as to limit the power drawn by the linear amplifier.

The controller 340 may thus be configured so that the magnitude of the current threshold $i_{TH}$ may be controllably varied based on the indication $S_{SL}$ of the level of the output signal $V_{OUT}$. The controller 340 may thus control the amplifier circuitry in the first dual-amplifier mode of operation, with a first current threshold $i_{TH1}$ when the indication $S_{SL}$ of the signal level of the output signal is at a first signal level, or within a first range. However, if the indication $S_{SL}$ of the signal level of the output signal is at a second, lower level, or within a second lower range, the controller 340 may operate in the second dual-amplifier mode of operation, with a second, higher, current threshold $i_{TH2}$.

In some implementations there may be additional dual-amplifier modes of operation, i.e. in addition to the first and second dual-amplifier modes, each of which has a different current threshold $i_{TH}$ and which are used for different levels, or ranges, of output signal. In some implementations the current threshold $i_{TH}$ may be variable in a relatively continuous manner, over at least a range of output signal level, so that the current threshold may be varied over a range of different threshold values with changes in the indication $S_{SL}$ of the signal level of the output signal $V_{OUT}$. In this case, the first and second dual-amplifier modes of operation (and any additional modes) can be seen as sub-modes of an overall dual-amplifier mode of operation, with a variable current limit for the linear amplifier stage 110. In other words, the controller 340 may control switching of the switching amplifier stage 130 based on the current of the first drive signal so as to limit the current of the first drive signal to a current limit, and the controller is configured to vary the current limit based on the indication of signal level of the output signal so as to provide at least the first and second dual-amplifier modes of operation.

The relevant current threshold magnitude $i_{TH}$ for a given expected signal level, or range of signal levels, of the output signal $V_{OUT}$ may be predetermined, for instance by considering the switching losses at a given switching frequency $f_{SW}$ against the losses of the linear amplifier stage 110. The relevant current threshold to be applied for a given indication $S_{SL}$ of output signal may be stored in a suitable memory, such as a look-up table or the like.

In some implementations the current threshold $i_{TH}$ may be controllably varied based on the indication $S_{SL}$ of output signal level so as to maintain a relatively stable switching frequency. Where the indication $S_{SL}$ of output signal level corresponds to the instantaneous signal level of the output signal, this may result in the current threshold being varied so as to maintain a substantially stable switching frequency through a cycle of the waveform of the output signal. Where the indication $S_{SL}$ of output signal level instead corresponds to an envelope or amplitude value of the output signal $S_{OUT}$, the current threshold $i_{TH}$ may be varied based on the envelope or amplitude value so that the switching frequency at the peak output signal level is substantially constant.

Figure 6:
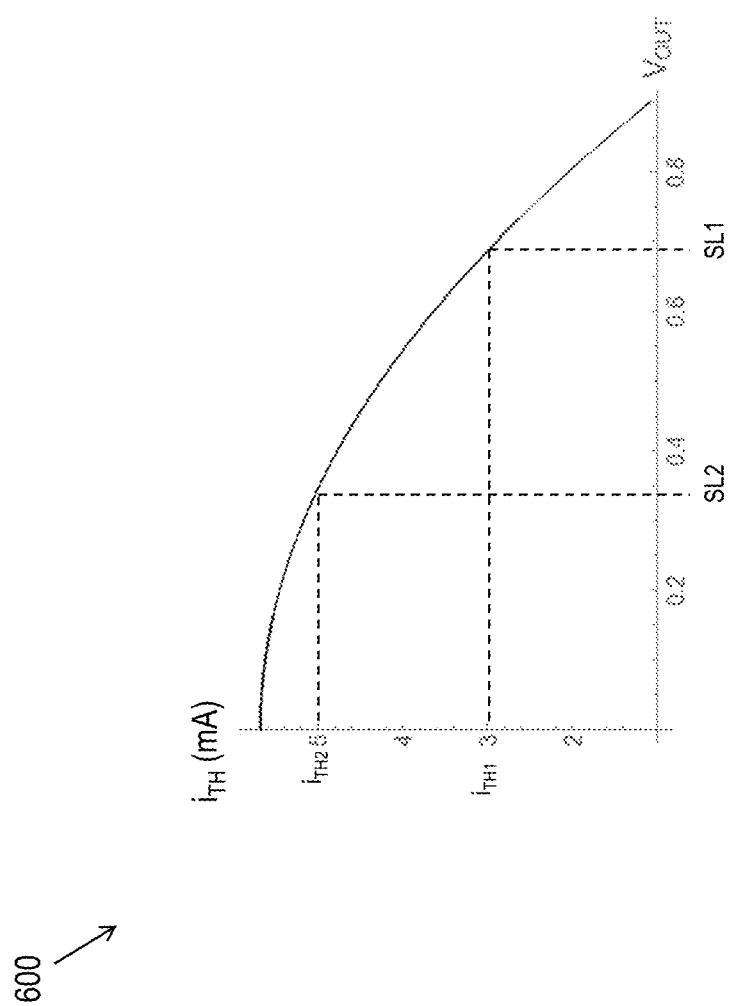
FIG. 6 illustrates one example of how a current threshold may be varied with signal level.

FIG. 6 illustrates one example of a possible relationship between current threshold magnitude $i_{TH}$ and indication $S_{SL}$ of the level of the output signal $V_{OUT}$. The example relationship of FIG. 6 was determined to provide a switching frequency $f_{SW}$ that is substantially constant with the level of output signal $V_{OUT}$. As illustrated, for smaller signal levels i.e. smaller values of $V_{OUT}$, the current threshold magnitude $i_{TH}$ is larger than for higher signal levels of the output signal. At a first signal level SL1, the current threshold is a first threshold $i_{TH1}$, whereas for a second, lower, signal level SL2, the current threshold is a second, higher, threshold $i_{TH2}$.

As noted above, in some examples, the controller 340 may be configured to vary the current threshold magnitude in a relatively continuous manner, across at least a range of signal levels of the output signal $V_{OUT}$. FIG. 6 illustrates an example where the current threshold may be varied substantially continuously over a full output range of the output signal, i.e. in a normalised output range from 0 to 1. In some implementations, however, the current threshold may be reduced with increasing signal level of the output signal $V_{OUT}$ up to some upper limit, beyond which the current threshold is not reduced further, i.e. there may be a minimum current threshold which is used for an upper range of signal levels. Additionally or alternatively, the current threshold may be increased with reducing signal level of the output signal $V_{OUT}$ to some lower signal limit, beyond which the current threshold is not reduced further, i.e. there may be a maximum current limit. In some cases, if the indication $S_{SL}$ of the signal level of the output signal is below a signal threshold for a single-amplifier mode of operation (which may be the same as, or lower, than the lower signal limit) the controller 340 may control the amplifier circuitry to operate in the single-amplifier mode as discussed above.

The current threshold may be varied in a variety of ways, as will be understood by one skilled in the art. For instance, in some applications the current threshold may be applied by generating a monitoring signal based on the current of the first drive signal and comparing the monitoring signal to a suitable reference, and the current threshold could be controlled by varying the reference, or a conversion gain associated with the monitoring signal. In some embodiments, at least some of the variation of the current threshold may be achieved by controllably varying a delay between detecting that the current of the first drive signal has reached a monitored value and subsequently switching the state of the switching amplifier stage 130.

Referring again to FIG. 3, circuitry 300 may thus comprise a delay element 350 arranged in the path between current monitoring circuit 312 and controller 340. The controller 340 may be configured to control or modulate a delay provided by delay element 350 based on the expected level of the output signal $V_{OUT}$, to effectively vary a current limit applied to the linear amplifier stage 110 and provide the different dual-amplifier modes of operation.

For example, as described above, current monitoring circuit 312 may be configured to compare the current of the first drive signal $i_{AB}$ to a reference value. Responsive to the current $i_{AB}$ reaching the reference value, the logic state of monitoring signal $S_{MON}$ may vary. If there were substantially no delay in the path between current monitoring circuit 312 and controller 340, the monitoring signal $S_{MON}$ received at the controller 340 will change state as soon as the output of the current monitoring circuit 312 changes states, and this change in state would trigger the controller 340 to switch the state of the switching amplifier stage. This will limit the current of the first drive signal to a threshold that corresponds to the reference value.

However, if the variable delay 350 imparts a non-zero delay, then there will be a delay between the output of the current monitoring circuit 312 changing state, and that change in state reaching the controller 340. During this delay period the switching amplifier stage 130 will remain in the same state, e.g. connected to the high-side or low-side voltage, and the current of the second drive signal $i_D$ will continue to ramp up or down. The current of the first drive signal $i_{AB}$ will thus also continue to ramp down or up during this period and thus will exceed the current corresponding the reference value. The amount by which the current of the first drive signal $i_{AB}$ exceeds this reference current value depends on the duration of the delay (and the current ramp rate).

The duration of the delay thus effectively controls the extent to which the current first drive signal $i_{AB}$ may exceed the reference current value, and hence the current threshold applied to the linear amplifier. The variable delay 350 may be a variable digital delay, for instance a counter-based delay, which is advantageous as it allows the variation in current threshold to be implemented in the digital domain.

The controller 340 may thus be operable to control a mode of operation of the amplifier circuitry 300 based on an indication $S_{SL}$ of the signal level of the output signal $V_{OUT}$ so as to improve the power efficiency of the amplifier circuitry. In some examples the controller 340 may be operable in a single-amplifier mode of operation for relatively low-level output signals, and operable in a dual-amplifier mode of operation for output signals with a higher signal level. In some implementations the controller 340 may be operable so that, in a dual-amplifier mode of operation, a current limit for the linear amplifier stage may be controllably varied.

In some implementations, when operating in a dual-amplifier mode of operation, the switching of the switching amplifier stage may be asynchronous. That is, as would be conventional for a dual-amplifier circuit, the switching amplifier stage 130, when enabled, may switch between its output node being connected to the high supply voltage terminal $V_H$ and the low supply voltage terminal $V_L$ at any time, as determined by the current monitoring circuit.

However, in some examples, the amplifier circuitry 300 may be configured such that, when active, any switching of the switching amplifier stage is synchronous to a clock signal. For example, controller 340 may be configured to receive a clock signal CLK and control the switching of the switching amplifier stage 130 so as to be synchronous to the clock signal CLK. The controller 340 may thus control the switching of the switching amplifier stage 130, such that switching between the high and low supply voltages is synchronised to a clock edge of the clock signal CLK. Restricting the switching of the switching amplifier stage 130 to a time dictated by the clock signal CLK can be advantageous in that it can provide an interval, between the relevant clock edges, where it is known that switching of the switching amplifier stage will not occur. This may provide a suitable interval for any processing by other circuitry, e.g. other circuitry formed as part of the same integrated circuit or chip as the amplifier circuitry 300, which could potentially be adversely impacted by switching of the switching amplifier stage 130. It will be understood that the switching of the switching amplifier stage, which involves the output of the switching amplifier stage being switched between the high and low supply voltages could potentially lead to some transients in other, sensitive circuitry. Any processing that may be adversely affected by such transients may thus be timed to occur between the relevant clock edges at which the switching amplifier stage 130 may be switched. For example, the interval provided by the synchronous switching of the switching amplifier stage 130, may provide an appropriate sampling time for other circuitry.

Figure 7A:
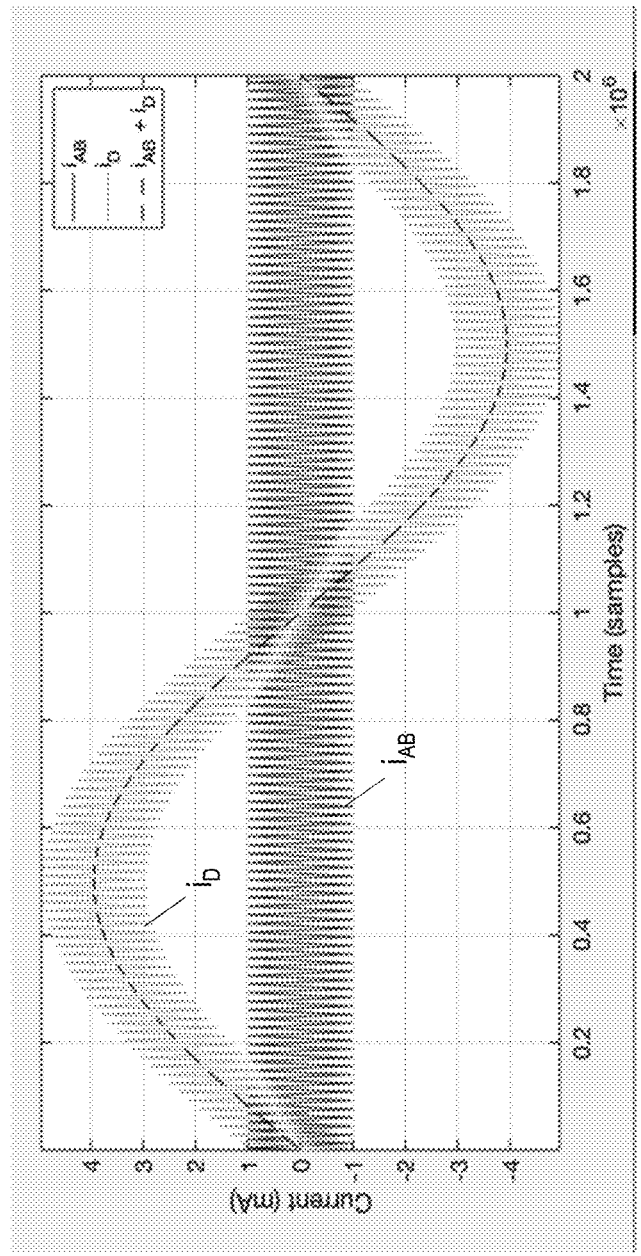
FIGS. 7a and 7b illustrate example current waveforms for asynchronous and synchronous switching.
Figure 7B:
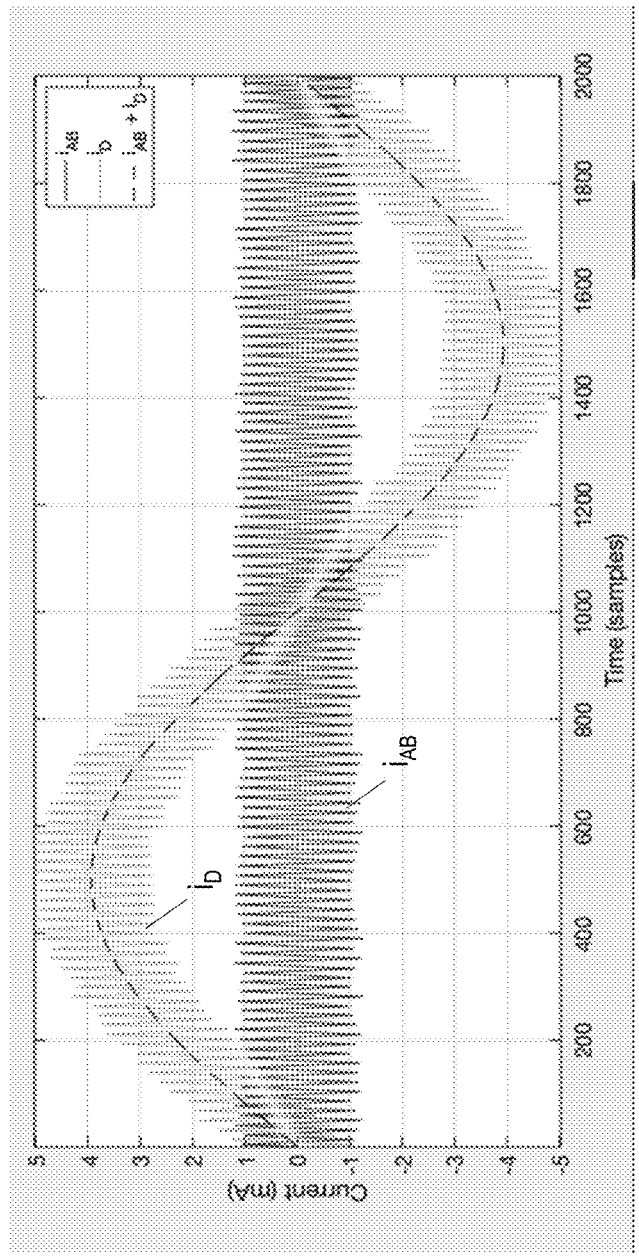

The synchronous switching of the switching amplifier stage 130 may result in an increased ripple in the current waveforms of first and second drive signals $i_{AB}$, $i_D$, compared to asynchronous switching of the switching amplifier stage 330. FIG. 7a illustrates example current waveforms of first and second drive signals $i_{AB}$, $i_D$, under asynchronous control by controller 340 and FIG. 7b illustrates example current waveforms of first and second drive signals $i_{AB}$, $i_D$, under synchronous control by controller 340. It can be seen that the current waveforms for first and second drive signals $i_{AB}$, $i_D$, exhibit a greater amount of ripple under synchronous control, illustrated in FIG. 7b, than under asynchronous control, as illustrated in FIG. 7a. In effect, rather than switch at a time determined solely by the current monitoring circuit 312, the switching of the switching amplifier stage is delayed until the next relevant clock edge of the clock signal. The synchronous behaviour thus adds a variable delay with a maximum value based on the clock period between the relevant clock edges. However, the increased switching ripple does not significantly impact of power efficiency and can be taken into account when setting an appropriate current limit and the increased ripple may not cause any significant impact on noise performance of the output signal from load 120. Whilst constraining the switching time of the switching amplifier stage 130 to be synchronous to a clock signal does provide some quantisation in time, the quantisation is within a feedback loop for the switching amplifier, and is noise shaped by operation of the loop as will be understood by one skilled in the art.

Whilst FIG. 3 illustrates that the synchronisation is provided by the controller 340, in examples where a digital delay 350 is present, the synchronisation may be applied by the delay 350.

At least some embodiments of the present disclosure thus relate to amplifier circuitry comprising a linear amplifier stage and a switching amplifier stage. The amplifier circuitry is operable, in a dual-amplifier mode of operation, in which both the linear amplifier stage and the switching amplifier stage are simultaneously active to drive the load, and the switching of the switching amplifier stage is controlled based on monitoring the current through the linear amplifier stage, such that the current through the linear amplifier stage is limited so as not exceed a first current threshold magnitude. In another mode of operation, the control of the switching amplifier may be varied based on an indication of the signal level of the output signal, e.g. based on the input signal.

In a single-amplifier mode of operation, switching of the switching amplifier may be disabled. In this mode the current through the linear amplifier stage is not constrained by the switching of the switching amplifier and thus the current through the linear amplifier may exceed the first current threshold.

Additionally or alternatively, in a dual-amplifier mode of operation, the switching of the switching amplifier may be controlled based on the current through the linear amplifier stage, but the switching may be controlled such that current through the linear amplifier is not limited to the first current limit threshold, but instead is limited to a higher threshold limit, so that the current through the linear amplifier can exceed the first current limit.

The different modes of operation may present more efficient modes of operation of a dual-amplifier circuit, for some signal levels, compared with operating in a dual-amplifier mode of operation with a fixed current threshold.

The skilled person will recognise that some aspects of the above-described apparatus and methods may be embodied as processor control code, for example on a non-volatile carrier medium such as a disk, CD- or DVD-ROM, programmed memory such as read only memory (Firmware), or on a data carrier such as an optical or electrical signal carrier. For many applications embodiments of the invention will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re)programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. Amplifier circuitry configured to receive an input signal and output an output signal at an output node, comprising:
   a linear amplifier stage configured to receive the input signal and output a first drive signal to the output node;
   a switching amplifier stage operable to output a second drive signal to the output node; and
   a controller for controlling the amplifier circuitry, the controller being selectively operable in:
      a first dual-amplifier mode in which the controller controls switching of the switching amplifier stage based on a current of the first drive signal such that the current of the first drive signal does not exceed a first current threshold magnitude; and
      at least one other mode in which the controller controls the switching amplifier stage such that the current of the first drive signal may exceed the first current threshold magnitude;
      wherein the controller is configured to selectively control said mode of operation based on an indication of signal level of the output signal; and
      wherein the at least one other mode comprises a single-amplifier mode, in which the switching amplifier stage is inactive and the first drive signal provides the entirety of the output signal.

2. The amplifier circuitry according to claim 1 wherein the controller is configured to operate in the single-amplifier mode when the indication of signal level of the output signal is less than a first signal level threshold.

3. The amplifier circuitry according to claim 1 wherein, in the single-amplifier mode, the controller is configured to control an amount of biasing applied to the linear amplifier stage to be lower than in the first dual-amplifier mode.

4. The amplifier circuitry according to claim 1 wherein the at least one other mode comprises a second dual-amplifier mode in which the controller controls switching of the switching amplifier stage based on the current of the first drive signal such that the current of first drive signal does not exceed a second current threshold magnitude, where the second current threshold magnitude is greater than the first threshold magnitude.

5. The amplifier circuitry according to claim 4 wherein the controller is configured to operate in the first dual-amplifier mode when the indication of signal level of the output signal indicates a first signal level and to operate the first dual-amplifier mode when the indication of signal level of the output signal indicates a second, lower, signal level.

6. The amplifier circuitry according to claim 4 wherein the controller is operable to control switching of the switching amplifier stage based on the current of the first drive signal so as to limit the current of the first drive signal to a current limit and the controller is configured to vary the current limit based on the indication of signal level of the output signal so as to provide at least said first and second dual-amplifier modes of operation.

7. The amplifier circuitry according to claim 6 wherein the controller is configured such that the current limit is substantially continuously variable over at least a range of signal levels of the output signal.

8. The amplifier circuitry according to claim 6 wherein the controller is configured to controllably vary the current limit by controlling a delay applied between the current of the first drive signal reaching a reference value and switching of the switching amplifier.

9. The amplifier circuitry according to claim 8 further comprising a monitoring circuit configured to monitor the first drive signal against the reference value and a variable delay element in a signal path between the monitoring circuit and the controller, wherein the controller is configured to control a delay of the variable delay element.

10. The amplifier circuitry according to claim 1 wherein the indication of signal level of the output signal is one of:

an indication of the instantaneous signal level of input signal; an indication of an envelope value of the input signal; an indication of a gain applied to the input signal and an indication of a volume setting for the input signal.

11. The amplifier circuitry according to claim 10 wherein the indication of signal level of the output signal is one of: an indication of an envelope value of the input signal and an indication of a gain applied to the input signal; and wherein the controller is configured to synchronise any change in mode of operation to a zero-crossing of the input signal.

12. The amplifier circuitry according to claim 1 wherein the controller is configured to receive a clock signal and control the switching amplifier stage such that any switching of the switching amplifier stage is synchronous to the clock signal.

13. The amplifier circuitry according to claim 1 implemented as an integrated circuit.

14. An electronic device comprising amplifier circuitry according to claim 1.

15. The electronic device as claimed in claim 14 wherein the electronic device is at least one of: a portable device; a battery powered device; a communications device; a mobile or cellular telephone; a smartphone device; a computing device; a laptop, notebook or tablet computer; a gaming device; a wearable device; a voice-controlled or voice activated device.

16. Amplifier circuitry configured to receive an input signal and output an output signal at an output node, comprising:

a linear amplifier stage configured to receive the input signal and output a first drive signal to the output node;
a switching amplifier stage operable to output a second drive signal to the output node; and
a controller operable to control the switching amplifier stage, wherein the controller is configured to receive an indication of signal level of the output signal and is operable such that:
at a first signal level of the output signal the controller controls switching of the switching amplifier stage based on a current of the first drive signal so that the current of the first drive signal does not exceed a first current limit; and
at a second, lower, signal level of the output signal, the controller controls switching of the switching amplifier so that the current of the first drive signal may exceed the first current limit;
wherein the controller is configured such that, at said second signal level of the output signal, the controller controls switching of the switching amplifier stage based on the current of the first drive signal so that the current of the first drive signal does not exceed a second current limit, which is greater than the first current limit.

17. The amplifier circuitry according to claim 16 wherein the controller is configured such that, at said second signal level of the output signal, the controller disables switching of the switching amplifier stage.

* * * * *